(12) United States Patent
Ando et al.

(10) Patent No.: US 6,525,519 B2
(45) Date of Patent: Feb. 25, 2003

(54) AMPLITUDE DETECTING CIRCUIT

(75) Inventors: Kimiaki Ando, Kanagawa (JP); Hiroki Shinde, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/894,107

(22) Filed: Jun. 28, 2001

(65) Prior Publication Data

US 2002/0000842 A1 Jan. 3, 2002

(30) Foreign Application Priority Data

Jun. 30, 2000 (JP) ........................................ 2000-198987

(51) Int. Cl.[7] .......................................... G01R 23/167
(52) U.S. Cl. ...................... 324/76.28; 700/55; 708/319
(58) Field of Search .......................... 324/76.28, 76.35; 708/300, 301, 316, 319; 341/155, 157; 702/189, 190; 700/37, 55

(56) References Cited

U.S. PATENT DOCUMENTS

| | | | |
|---|---|---|---|
| 4,388,693 A | * 6/1983 | Nakayama | .................. 364/724 |
| 4,754,419 A | 6/1988 | Yoshihiro | |
| 5,124,707 A | * 6/1992 | Stove | .......................... 341/157 |
| 5,353,306 A | 10/1994 | Takeshi | |
| 5,576,976 A | * 11/1996 | White | .......................... 364/572 |

FOREIGN PATENT DOCUMENTS

| | | |
|---|---|---|
| JP | 5-14128 | 1/1993 |
| JP | 5-291883 | 11/1993 |

* cited by examiner

*Primary Examiner*—Christine Oda
*Assistant Examiner*—Etienne LeRoux
(74) *Attorney, Agent, or Firm*—Pearne & Gordon LLP (57) ABSTRACT

An amplitude detecting circuit (1) includes a simple digital filter (2) having a structure corresponding to a part where the energy is concentrated in the full impulse response of a signal processing digital filter (3). Concretely, for example, the amplitude detecting circuit (1) (simple digital filter (2)) includes only four central taps having coefficients of large absolute values and considerably affecting on the output amplitude among sixteen taps of the signal processing digital filter (3). By the amplitude detecting circuit (1), the amplitude of an output signal of the signal processing digital filter (3) can approximately be detected.

8 Claims, 8 Drawing Sheets

PRIOR ART

FIG. 10

PRIOR ART

AMPLITUDE DETECTING CIRCUIT

BACKGROUND OF THE INVENTION

The present invention relates to an amplitude detecting circuit for detecting an amplitude of an output signal of a digital filter, for example, used in a system such as the radio communications, cable communications, signal processing or control.

Previously, in a system using a digital filter, for example, in order to perform the automatic gain control or the peak suppression control, it is necessary to detect the amplitude of an output signal of the above-described digital filter.

Figure 9:
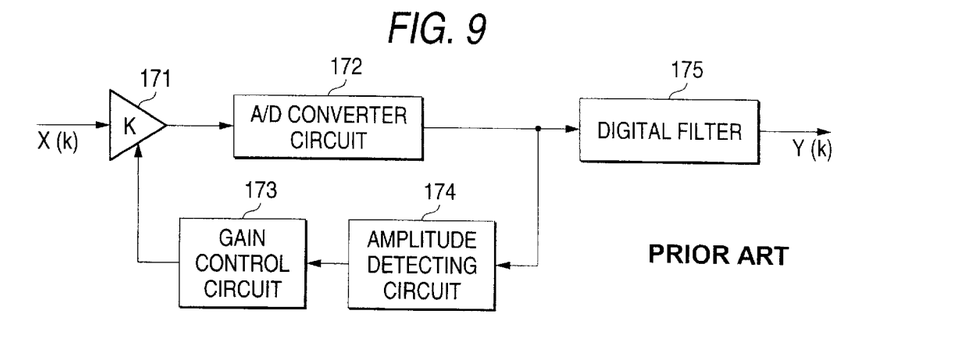
FIG. 9 is a block diagram showing one example of the conventional automatic gain control circuit.

FIG. 9 is a block diagram showing one example of a conventional automatic gain control circuit. In FIG. 9, an input signal X(k) is amplified by an amplifier circuit 171, and converted into a digital signal by an A/D converter circuit 172, and after that, it is supplied to a digital filter 175. In the digital filter 175, a given filter processing is applied to the supplied digital signal, and after that, it is output as an output signal Y(k). Furthermore, the digital signal from the A/D converter circuit 172 is also supplied to an amplitude detecting circuit 174, and an amplitude of the output signal Y(k) from the digital filter 175 is detected. This amplitude information is supplied to a gain control circuit 173, and a gain control signal corresponding to the above-described amplitude information is created. Then, this gain control signal is supplied to the amplifier circuit 171. That is, the gain control signal created on the basis of the amplitude information of the detected output signal Y(k) is fed back to the amplifier circuit 171, so that the gain control may automatically be performed.

Figure 10:
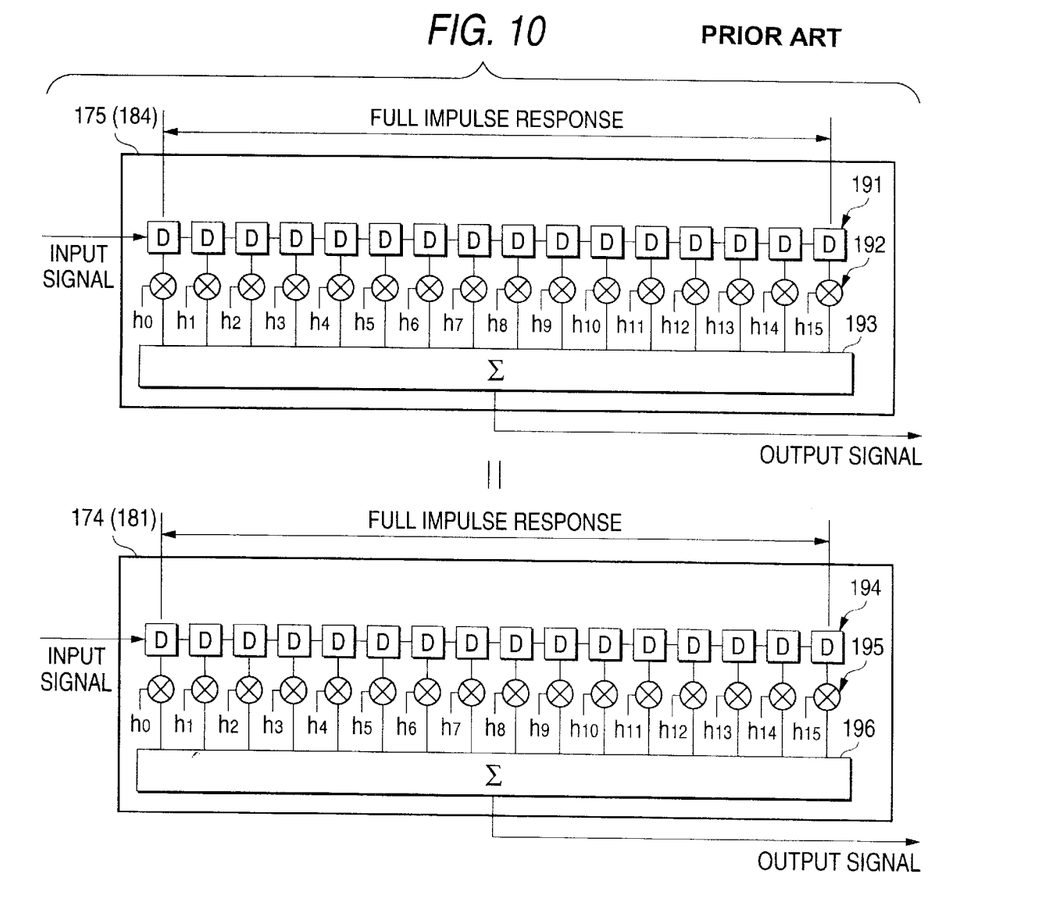
FIG. 10 is a block diagram showing the concrete structure of the digital filter and amplitude detecting circuit in the automatic gain control circuit of FIG. 9.

Here, concretely, the digital filter 175 has such a structure as shown in FIG. 10. That is, the digital filter 175 is a non-recursive digital filter with sixteen taps, and it comprises sixteen delay units 191, sixteen multipliers 192 respectively connected to the above-described delay units 191 and having coefficients $h_0$ to $h_{15}$ set, and one adder 193 respectively connected to the above-described multipliers 192.

Figure 11:
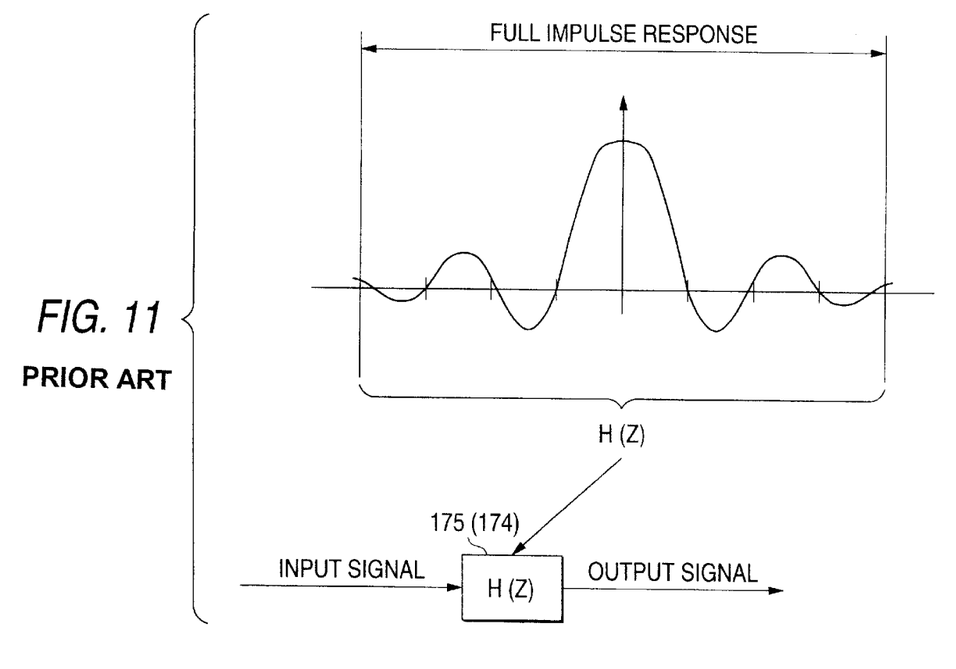
FIG. 11 is a figure showing one example of the impulse response characteristic of the digital filter in the automatic gain control circuit of FIG. 9.

Furthermore, the digital filter 175 has such an impulse response characteristic as shown in FIG. 11, and a non-recursive digital filter (transfer function H(z)) having a structure corresponding to the total of this impulse response (hereafter, referred to as "full impulse response") is used as the amplitude detecting circuit 174. That is, as shown in FIG. 10, the amplitude detecting circuit 174 comprises sixteen delay units 194, sixteen multipliers 195 respectively connected to the above-described delay units 194 and having coefficients $h_0$ to $h_{15}$ set, and one adder 196 respectively connected to the above-described multipliers 195. Thus, in a conventional automatic gain control circuit, the amplitude of an output signal Y(k) has been detected by using a digital filter having the same structure as the digital filter 175, as the amplitude detecting circuit 174.

Figure 12:
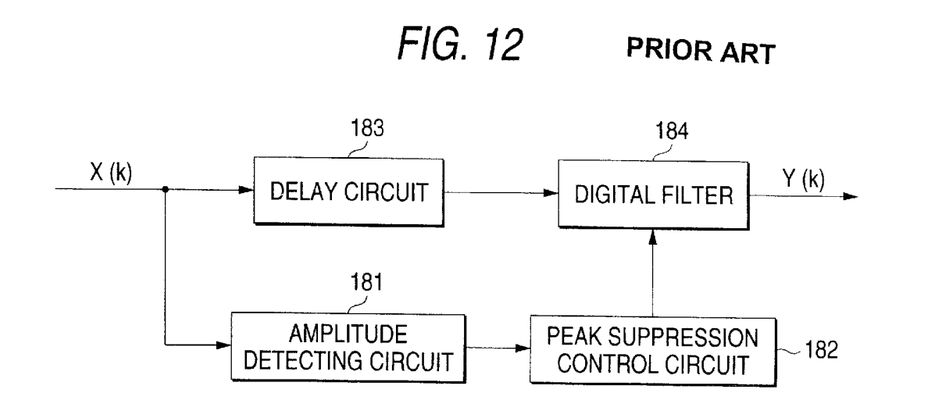
FIG. 12 is a block diagram showing one example of the conventional peak suppression circuit.

On the other hand, FIG. 12 is a block diagram showing one example of a conventional peak suppression circuit. In FIG. 12, an input signal X(k) is delayed by a given time in a delay circuit 183, and supplied to a digital filter 184. In the digital filter 184, a given filter processing is applied to the supplied delayed input signal, and after that, it is output to as an output signal Y(k). Furthermore, the input signal X(k) is also supplied to an amplitude detecting circuit 181, and the amplitude of an output signal Y(k) from the digital filter 184 is detected. This amplitude information is supplied to a peak suppression control circuit 182, and a peak suppression control signal corresponding to the above-described amplitude information is created. Then, this peak suppression control signal is supplied to the digital filter 184. That is, the peak suppression control signal created on the basis of the amplitude information of the detected output signal Y(k) is fed forward to the digital filter 184, so that the control of the peak suppression may automatically be performed.

Here, the digital filter 184 has such a structure as shown in FIG. 10, similarly to the above-described digital filter 175. Furthermore, the amplitude detecting circuit 181 also has such a structure as shown in FIG. 10, similarly to the above-described amplitude detecting circuit 174. That is, in the conventional peak suppression circuit, the amplitude of an output signal Y(k) has been also detected by using a digital filter having the same structure as the digital filter 184, as the amplitude detecting circuit 181.

However, in the case of performing such a feed back control where the input level to the digital filter 175 is controlled on the basis of the detection results of the amplitude of an output signal from the digital filter 175 like the conventional automatic gain control circuit, the detection of the amplitude is performed by using the amplitude detecting circuit 174 that is a digital filter having the same structure as the digital filter 175, and therefore, the processing delay according to the amplitude detection is large, and accordingly, the time constant of the feed back becomes large, and such a problem that the high speed tracking is impossible has been created. Furthermore, another digital filter having the same structure becomes necessary besides the digital filter 175 used for the actual signal processing, and the increase of the circuit size has been caused.

Furthermore, in the case where the feed forward control to the digital filter 184 is performed on the basis of the detection results of the amplitude of an output signal of the digital filter 184 like the conventional peak suppression circuit, it is necessary to determine the control information (peak suppression control signal) before performing the signal processing by the digital filter 184, and therefore, it has been necessary to delay the supply of an input signal into the digital filter 184 by the delay circuit 183, expecting the processing delay time according to the amplitude detection in the amplitude detecting circuit 181. In the case of a conventional peak suppression circuit, the amplitude of an output signal is detected by the amplitude detecting circuit 181 that is a digital filter having the same structure as the signal processing digital filter 184, and therefore, the processing delay for the amplitude detection is large, and as a result, the processing delay for the signal processing has also become large. Furthermore, in this conventional peak suppression circuit, another digital filter having the same structure is also necessary besides the digital filter 184 used for the actual signal processing, and the increase of the circuit scale has been caused.

SUMMARY OF THE INVENTION

The present invention has been made due to such conventional problems, and it is an object to provide an amplitude detecting circuit in which the processing delay according to the amplitude detection of an output signal of the signal processing digital filter is small, and the circuit scale can be decreased.

In order to attain the above-described object, the amplitude detecting circuit according to a first aspect of the present invention comprises a simple digital filter having a plurality of taps corresponding to the part where the energy is concentrated in the full impulse response of a non-recursive signal processing digital filter, and it is characterized in that it supplies the same signal as a signal supplied to the above-described signal processing digital filter, to the above-described simple digital filter, and that it approximately detects an output amplitude of the above-described signal processing digital filter as an output of the above-described simple digital filter.

According to a second aspect of the present invention, when a signal making the output amplitude maximum is supplied to the above-described signal processing digital filter, the plurality of taps of the above described simple digital filter are selected from the taps of the above described signal processing digital filter located around the tap with a coefficient of the maximum absolute value among all taps of the signal processing digital filter, and that the taps are selected so that the ratio of the sum total of absolute values of coefficients of selected taps to the sum total of absolute values of coefficients of all taps is greater than or equal to some fixed value.

According to a third aspect of the present invention, the above-described fixed value is set according to the required detection accuracy of the output amplitude.

According to a fourth aspect of the present invention, the above-described simple digital filter comprises an amplitude storing part for storing the information of an output amplitude corresponding to a pattern of a supplied signal, and that the information of the output amplitude read out of the above-described amplitude storing part is made an output of the above-described simple digital filter.

According to a fifth aspect of the present invention, the above-described simple digital filter comprises a peak generating pattern storing part for storing a peak generating pattern that is a pattern of a signal generating an output amplitude of a given value or more, and that a peak detection signal is output from the above-described peak generating pattern storing part, when a pattern of the supplied signal agrees with the above-described peak generating pattern.

DETAILED DESCRIPTION OF THE PREFERRED EMBODIMENTS

Figure 1:
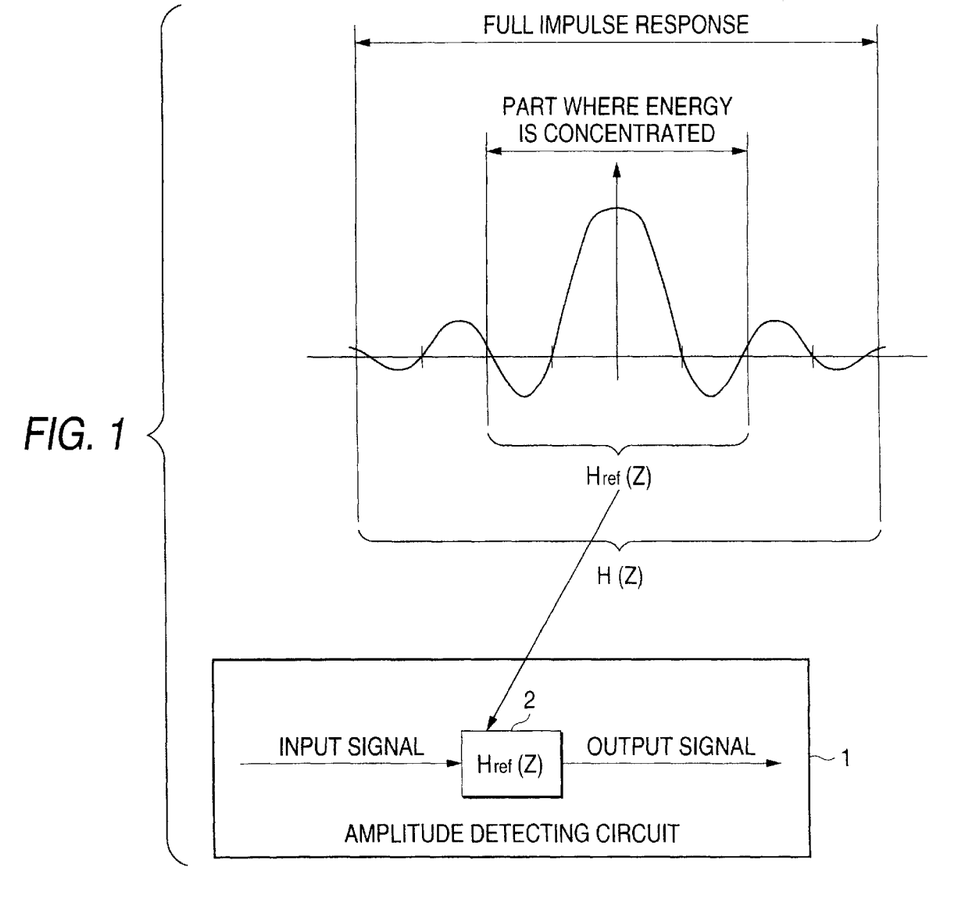
FIG. 1 is a figure for explaining the outline of the present invention.
Figure 2:
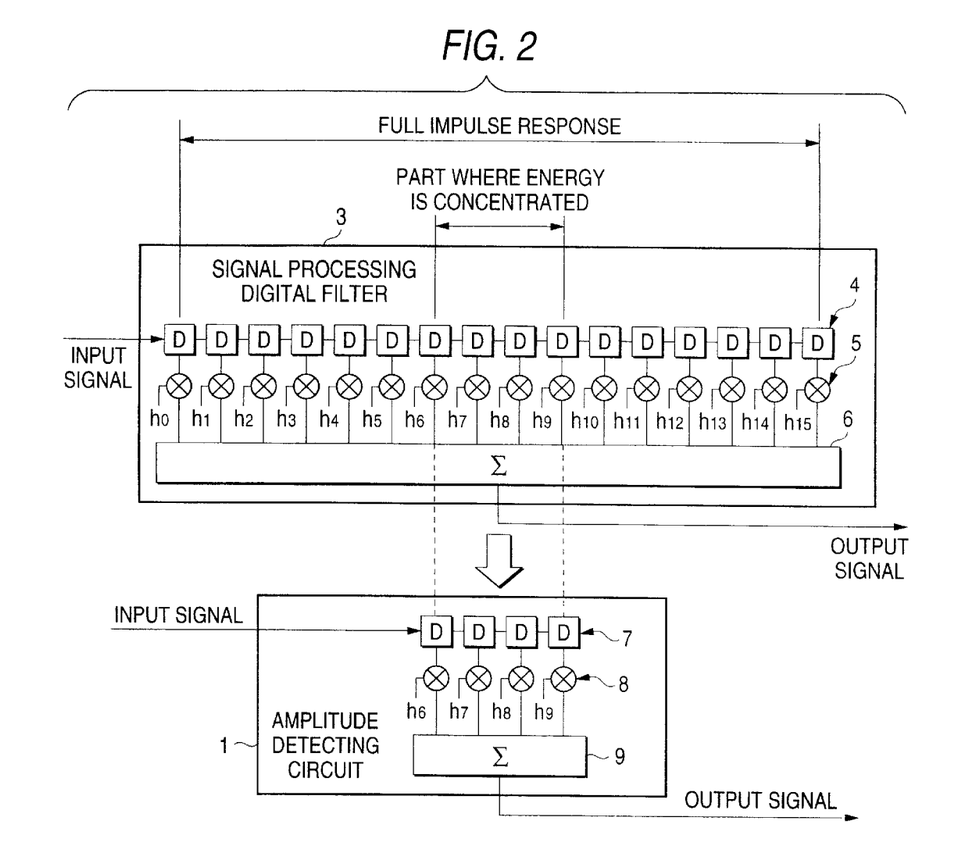
FIG. 2 is a figure for explaining the outline of the present invention.

First, the outline of the present invention will be described while referring to FIG. 1 and FIG. 2. Usually, the coefficient of each tap of the non-recursive digital filter has a value Hs(t) obtained by discretely taking out an impulse response H(t) appearing when a delta function δ(t) is given to the above-described filter, by sampling. On the other hand, the number of taps is the factor to determine the accuracy of the digital filter, and usually, a filter with a lot of taps is used. However, for example, as shown in FIG. 1, in the impulse response to be actually used, there are many cases where the part considerably affecting on the output amplitude is the part in the range of one-ninth to one-half of the full impulses response that is the part in which the energy is concentrated, and as shown in FIG. 2, the impulse response is sampled to be the coefficient of each tap. In the digital filter 3 made of a delay unit 4, a multiplier 5, and an adder 6, there are many cases where the number of taps having large coefficients and considerably affecting on the output amplitude is one-ninth to one-half of the total number of taps. The present invention has been made by giving attention to this fact, and it provides an amplitude detecting circuit 1 made of a simple digital filter 2 (transfer function Href(z)) having a structure corresponding to the part where the energy is concentrated in full impulse response (refer to FIG. 1). Concretely, as shown in FIG. 2, the amplitude detecting circuit 1 (simple digital filter 2) is made of only four central taps among sixteen taps of the signal processing digital filter 3. That is, the amplitude detecting circuit 1 comprises four delay units 7, four multipliers 8 respectively connected to the above-described delay units 7 and having coefficients $h_6$ to $h_9$ set, and one adder 9 respectively connected to the above-described multipliers 8. By the amplitude detecting circuit 1, the amplitude of an output signal of the signal processing digital filter 3 can approximately be detected.

[First Embodiment]

Figure 3:
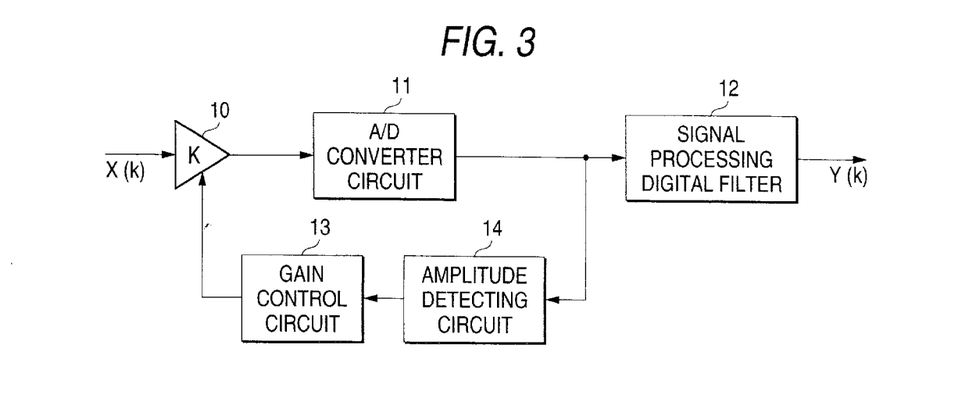
FIG. 3 is a block diagram showing an automatic gain control circuit made up by using an amplitude detecting circuit according to a first embodiment of the present invention.

FIG. 3 is a block diagram showing an automatic gain control circuit made up by using an amplitude detecting circuit 14 according to the first embodiment of the-present-invention. In FIG. 3, an amplifier circuit 10 to which the input signal X(k) is supplied is connected to an A/D converter circuit 11 for converting the amplified input signal to a digital signal, and the above-described A/D converter circuit 11 is connected to a digital filter 12 that applies a given filter processing to the supplied digital signal and outputs the signal as the output signal y(k). Furthermore, the A/D converter circuit 11 is also connected to an amplitude detecting circuit 14 that approximately detects the amplitude of an output signal Y(k) of the digital filter 12 from the supplied digital signal, and the above-described amplitude detecting circuit 14 is connected to a gain control circuit 13 that creates a gain control signal according to the detected amplitude information and supplies that to the amplifier circuit 10. That is, the gain control signal created on the basis of the amplitude information of the approximately detected output signal Y(k) is fed back to the amplifier circuit 10, and the gain control is automatically performed.

Figure 4:
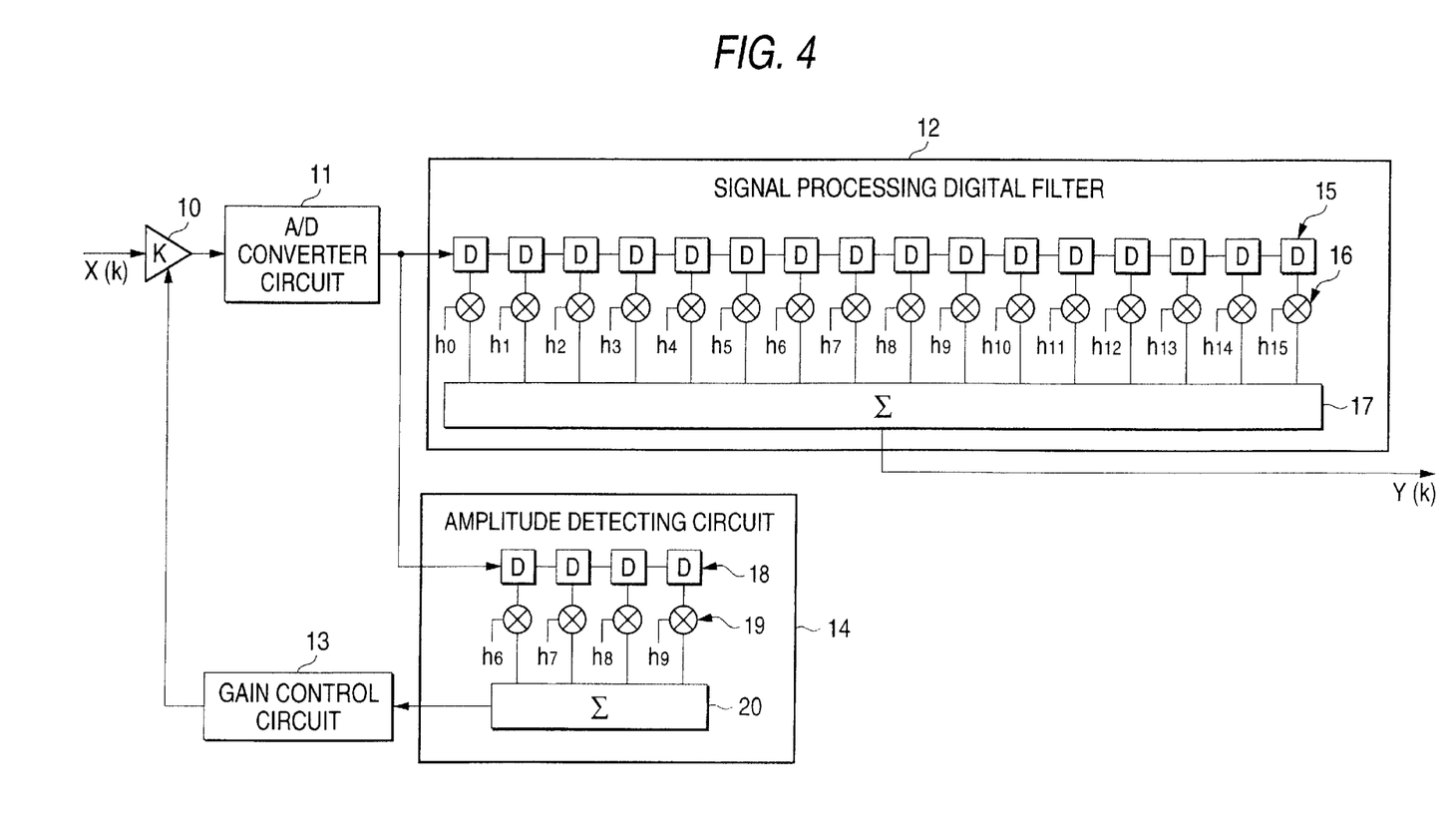
FIG. 4 is a block diagram showing the concrete structure of a digital filter and an amplitude detecting circuit in the automatic gain control circuit of FIG. 3.

Concretely, the digital filter 12 and the amplitude detecting circuit 14 have such structures as shown in FIG. 4. That is, the digital filter 12 is a non-recursive digital filter with sixteen taps, and it comprises sixteen delay units 15, sixteen multipliers 16 respectively connected to the above-described delay units 15 and having coefficients $h_0$ to $h_{15}$ set, and one adder 17 respectively connected to the above-described multipliers 16. On the other hand, the amplitude detecting circuit 14 is made of a simple digital filter having a structure corresponding to the part where the energy is concentrated in the full impulse response of the digital filter 12. That is, the amplitude detecting circuit 14 (simple digital filter) is made of four central taps that have coefficients $h_6$ to $h_9$ of large absolute values and considerably affect on the output amplitude among sixteen taps of the signal processing digital filter 12. More concretely, the amplitude detecting circuit 14 (simple digital filter) comprises four delay units 18, four multipliers 19 respectively connected to the above-described delay units 18 and have coefficients $h_6$ to $h_9$ set, and one adder 20 respectively connected to the above-described multipliers 19. Herein, for example, a shift register is used for the delay unit 18. By the amplitude detecting circuit 14, the amplitude of an output signal Y(k) of the signal processing digital filter 12 can approximately be detected.

Here, the taps making up the amplitude detecting circuit 14 (simple digital filter) may be selected, for example, as follows. That is, taps of one-ninth to one-half (four in the present embodiment) around the tap with a coefficient of the maximum absolute value among all taps (sixteen in the present embodiment) of the above-described digital filter 12 are selected, when supplying the input signal pattern making the output amplitude maximum, to the signal processing digital filter 12. At that moment, the taps of the amplitude detecting circuit 14 are selected so that the sum total of absolute values of coefficients of the selected taps to the sum total of absolute values of coefficients of all taps of the digital filter 12 is greater than or equal to a fixed value. This tap selecting method shows that the detection error of maximum ±(1−fixed value)×100% is created when the omitted taps give the maximum effect on the output amplitude, and it is a selecting method that specifies the maximum value of the detection error at the time of the maximum amplitude output. Herein, the above-described fixed value is set according to the required detection accuracy of the output amplitude.

Other than the above-described method that specifies the maximum value of the detection error at the time of the maximum amplitude output, it is also possible that various input signal patterns supplied to the digital filter 12 and taps are selected so that the average of the detection error may fall in the range of ± fixed value, to the output amplitude of the above-described digital filter 12.

Furthermore, in an application where the time until the output of the amplitude information is specified like an automatic gain control circuit, it is also possible to determine the number of taps from the permissible processing time.

Furthermore, the number of taps used for the amplitude detection may be different depending on the application. For example, in the case of a root Nyquist filter with a roll off ratio of 0.22, when a simple digital filter with ten taps of the coefficient of eight bits and output of twelve bits is used to the signal processing digital filter with forty-eight taps of the coefficient of eight bits and output of twelve bits, the output amplitude can be detected with an accuracy of ±20%, and the detection time can be reduced by about one-fifth.

Next, the operation of the automatic gain control circuit of the present embodiment will be described. In FIG. 3 and FIG. 4, the input signal X(k) is amplified by the amplifier circuit 10, and is converted into a digital signal by the A/D converter circuit 11, and after that, it is supplied to the digital filter 12. In the digital filter 12, a given filter processing is applied to the supplied digital signal, and after that, it is output as the output signal Y(k). Furthermore, the digital signal from the A/D converter circuit 11 is also supplied to the amplitude detecting circuit 14, and the amplitude of the output signal Y(k) from the digital filter 12 is approximately detected. This detected amplitude information is supplied to the gain control circuit 13, and a gain control signal according to the above-described amplitude information is created. Then, this gain control signal is supplied to the amplifier circuit 10. That is, the gain control signal created on the basis of the amplitude information of the approximately detected output signal Y(k) is fed back to the amplifier circuit 10, and the gain control is automatically performed.

Thus, in the automatic gain control circuit of the present embodiment, the amplitude detecting circuit 14 has a structure corresponding to the part where the energy is concentrated in the full impulse response of the signal processing digital filter 12, that is, a structure made of the simple digital filter composed of four central taps having coefficients $h_6$ to $h_9$ of large absolute values and considerably affecting on the output amplitude among sixteen taps of the digital filter 12, so that the reduction of the circuit scale may be attained, and furthermore, the output amplitude of the digital filter 12 is approximately detected by this simple digital filter, and therefore, the processing delay according to the amplitude detection is small, and accordingly, the time constant of the feed back also becomes small, and the high speed tracking is possible.

Figure 5:
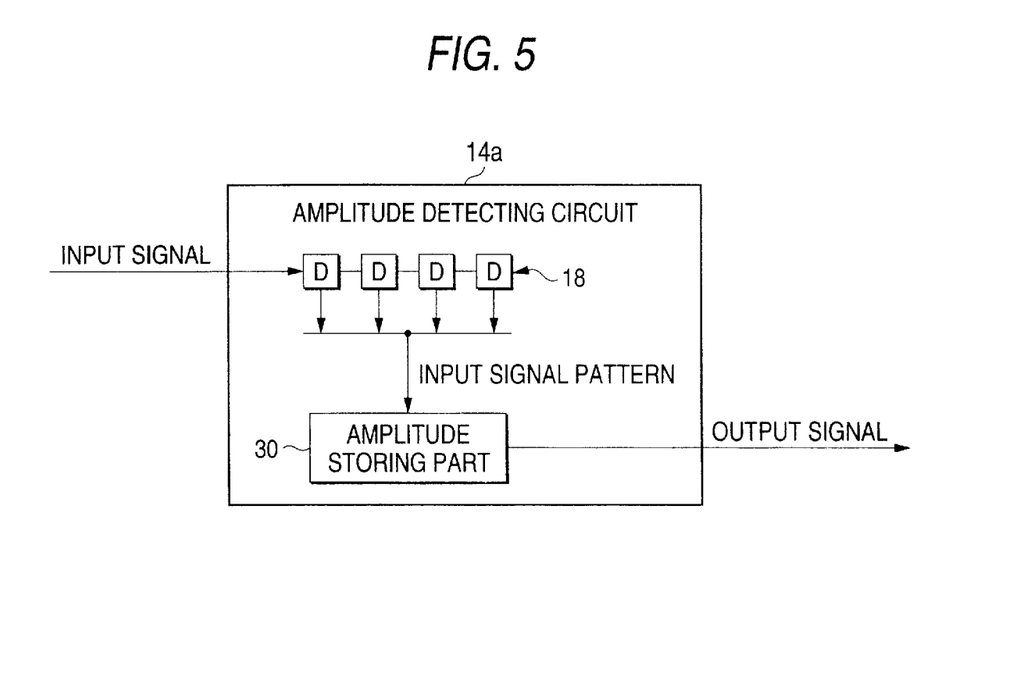
FIG. 5 is a block diagram showing another example of the structure of the amplitude detecting circuit in the automatic gain control circuit of FIG. 3.

Herein, such an amplitude detecting circuit 14a as shown in FIG. 5 can also be used instead of the amplitude detecting circuit 14. This amplitude detecting circuit 14a has such a structure where the multiplier 19 and the adder 20 of the amplitude detecting circuit 14 are replaced with an amplitude storing part 30. That is, the amplitude detecting circuit 14a comprises, for example, four delay units 18 made of the shaft register and the amplitude storing part 30 for storing the information of the output amplitude corresponding to the pattern of the input signal to be output from the above-described delay unit 18. By the amplitude detecting circuit 14a, the information of the output amplitude is read out of the amplitude storing part 30 according to the pattern of the input signal, and the amplitude of the output signal Y(k) of the signal processing digital filter 12 can approximately be detected.

Here, like the prior art, for example, a digital filter with sixteen taps is supposed, and when the number of input bits is one, the number of kinds of patterns of the input signals is the sixteenth power of two=65536, and an amplitude storing part 30 with a massive storage capacity is required, and therefore, the circuit structure shown in FIG. 5 is not practical, but in the case of the amplitude detecting circuit 14a corresponding to a digital filter with four taps, when the number of input bits is one, the number of kinds of patterns of the input signals is the fourth power of two=sixteen, and the amplitude storing part 30 may be an amplitude storing part with a small storage capacity, and therefore, the circuit structure shown in FIG. 5 is useful.

[Second Embodiment]

Figure 6:
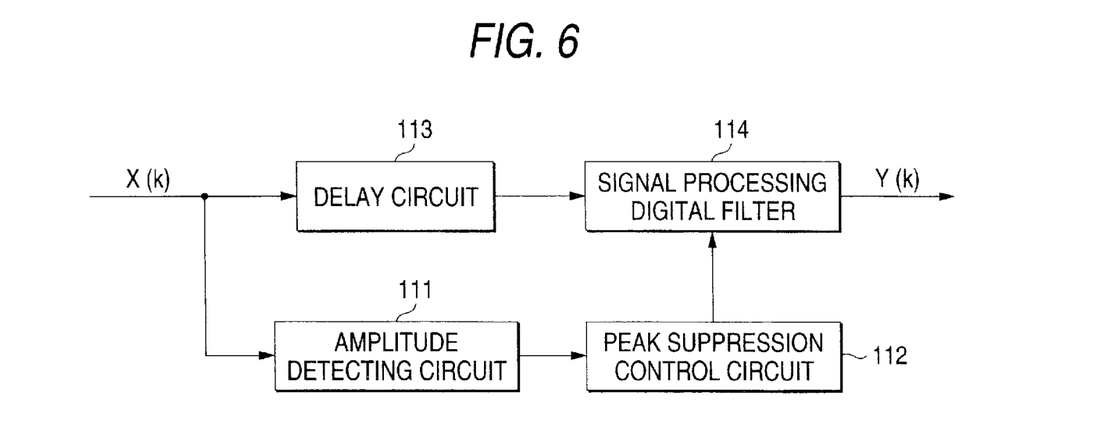
FIG. 6 is a block diagram showing a peak suppressing circuit made up by using an amplitude detecting circuit according to a second embodiment of the present invention.

FIG. 6 is a block diagram showing a peak suppression circuit made up by using an amplitude detecting circuit 111 according to the second embodiment of the present invention. In FIG. 6, the delay circuit 113 to which the input signal X(k) is supplied and which delays the above-described input signal by a given time is connected to a digital filter 114 for applying a given filter processing to the above-described input signal that has been delayed by a given time and outputs the signal as the output signal Y(k). Furthermore, the amplitude detecting circuit 111 to which the input signal X(k) is supplied and which approximately detects the amplitude of an output signal Y(k) of the digital filter 114 from the above-described input signal is connected to the peak suppression control circuit 112 for creating a peak suppression control signal according to the detected amplitude information and for supplying the signal to the digital filter 114. That is, the peak suppression control signal created on the basis of the amplitude information of the approximately detected output signal Y(k) is fed forward to the digital filter 114, and the control of the peak suppression is automatically performed.

Figure 7:
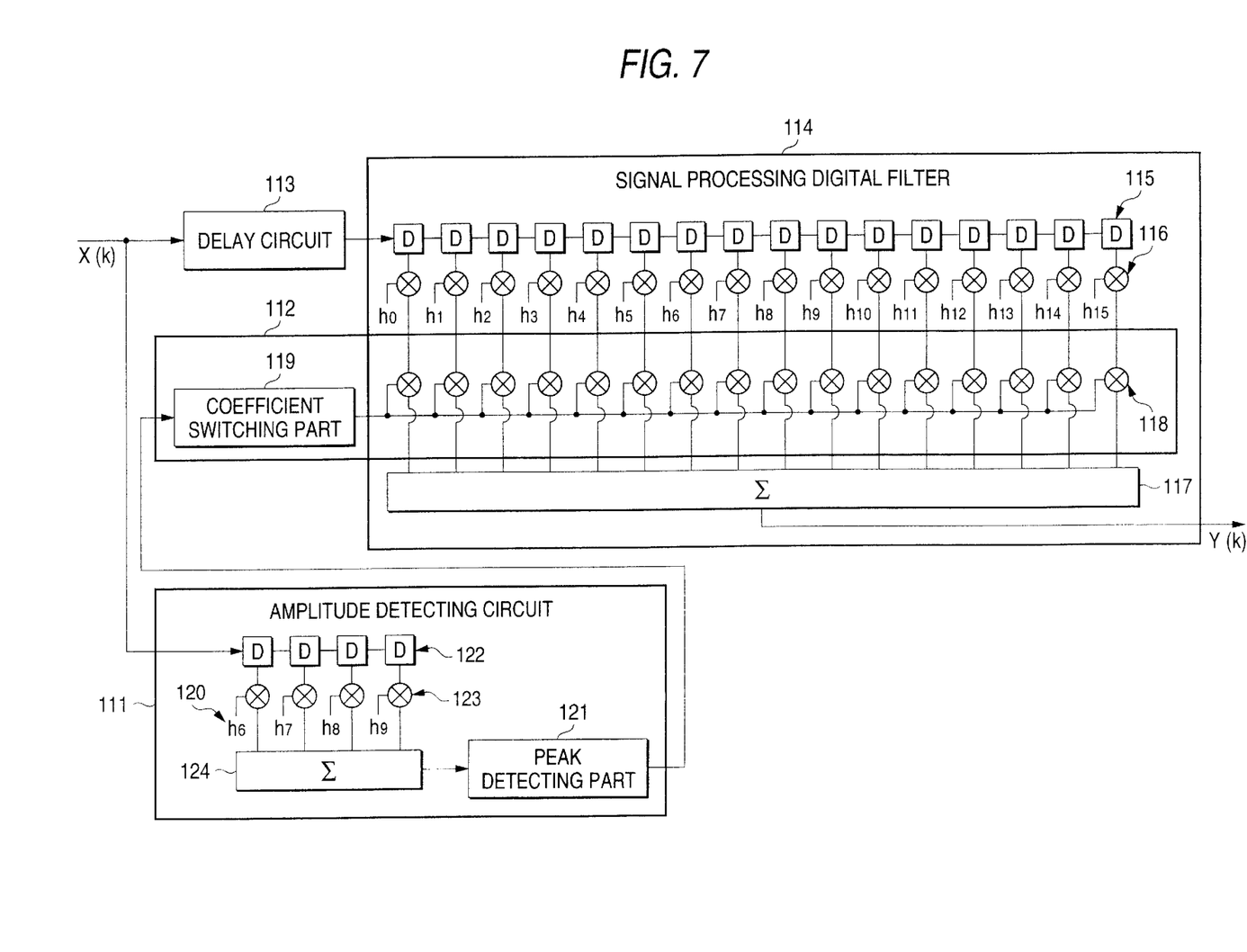
FIG. 7 is a block diagram showing the concrete structure of the digital filter, peak suppression control circuit, and amplitude detecting circuit in the peak suppression circuit of FIG. 6.

The digital filter 114, the peak suppression control circuit 112, and the amplitude detecting circuit 111 concretely have such structures as shown in FIG. 7. That is, the digital filter 114 is a non-recursive digital filter with sixteen taps, and it comprises sixteen delay units 115, sixteen multipliers 116 respectively connected to the above-described delay units 115 and having coefficients $h_0$ to $h_{15}$ set, and one adder 117 respectively connected to the multipliers 116 through the peak suppression control circuit 112. Furthermore, the peak suppression control circuit 112 comprises sixteen multipliers 118 respectively connected between the multipliers 116 and the adder 117 of the digital filter 114 and a coefficient switching part 119 for switching the coefficient of the multiplier 118 according to the peak detecting signal from the peak detecting part 121 of the amplitude detecting circuit 111 to be described later. On the other hand, the amplitude detecting circuit 111 comprises a simple digital filter 120 having a structure corresponding to the part where the energy is concentrated in the full impulse response of the digital filter 114 and a peak detecting part 121 that detects the fact that the amplitude of an output signal Y(k) approximately detected by the above-described simple digital filter 120 has a given value or more (existence of a peak) and supplies the peak detection signal to the coefficient switching part 119 of the peak suppression control circuit 112. The simple digital filter 120 is made of four central taps having coefficients $h_6$ to $h_9$ with large absolute values and considerably affecting on the output amplitude among sixteen taps of the signal processing digital filter 114. More concretely, the simple digital filter 120 comprises, for example, four delay units 122 made of the shift register, four multipliers 123 respectively connected to the above-described delay units 122 and having coefficients $h_6$ to $h_9$ set, and one adder 124 respectively connected to the above-described multipliers 123. Herein, the taps making up the simple digital filter 120 may be selected similarly to the case of the above-described first embodiment.

Next, the operation of the peak suppression circuit of the present embodiment will be described. In FIG. 7, the input signal X(k) is delayed by a given time in the delay circuit 113, and supplied to the digital filter 114. In the digital filter 114, a given filter processing is applied to the supplied delayed input signal, and after that, the signal is output as an output signal Y(k). Furthermore, the input signal X(k) is also supplied to the amplitude detecting circuit 111, and the amplitude of an output signal Y(k) from the digital filter 114 is approximately detected by the simple digital filter 120. When the fact that this amplitude has a given value or more (existence of a peak) is detected by the peak detecting part 121, the peak detection signal is supplied to the peak suppression control circuit 112, and the coefficient of the multiplier 118 is switched to a given value by the coefficient switching part 119, and the peak of the output signal Y(k) is automatically suppressed.

Thus, in the peak suppression circuit of the present embodiment, the amplitude detecting circuit 111 has a structure corresponding to the part where the energy is concentrated in the full impulse response of the signal processing digital filter 114, that is, a structure composed of the simple digital filter 120 made of four central taps having coefficients $h_6$ to $h_9$ of large absolute values and considerably affecting on the output amplitude among sixteen taps of the digital filter 114, so that the reduction of the circuit scale may be attained, and furthermore, the output amplitude of the digital filter 114 is approximately detected by this simple digital filter 120, and therefore, the processing delay for the amplitude detection is small, and accordingly, the processing delay for the signal processing also becomes small.

Figure 8:
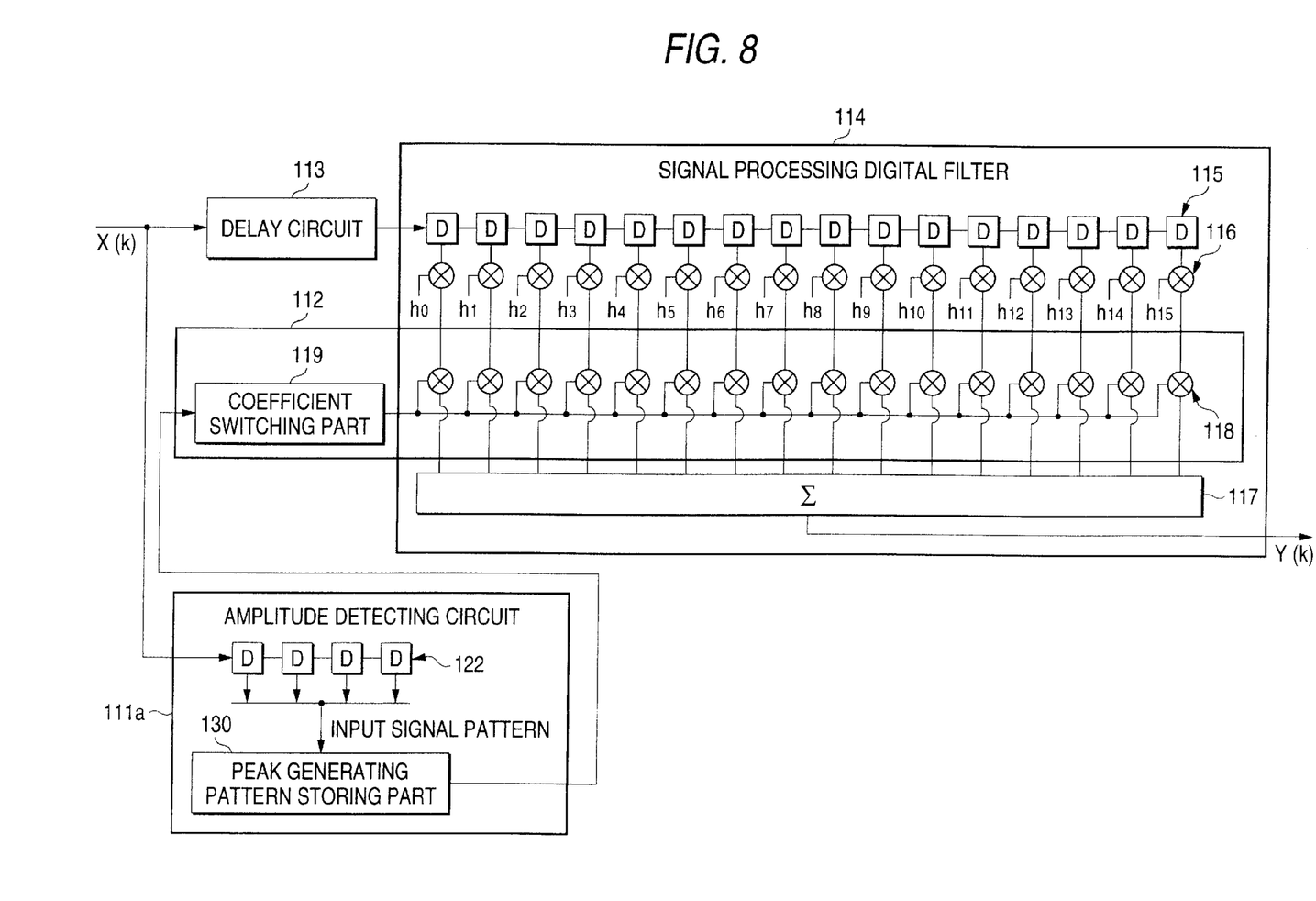
FIG. 8 is a block diagram showing another example of the structure of the amplitude detecting circuit in the peak suppression circuit of FIG. 6.

Herein, such an amplitude detecting circuit 111a as shown in FIG. 8 can also be used instead of the amplitude detecting circuit 111. This amplitude detecting circuit 111a has such a structure where the multiplier 123, the adder 124, and the peak detecting part 121 of the amplitude detecting circuit 111 are replaced with the peak generating pattern storing part 130. That is, the amplitude detecting circuit 111a comprises, for example, four delay units 122 made of the shift register and the peak generating pattern storing part 130 for storing the patterns creating an output amplitude of a given value or more (peak generating pattern). Then, when the pattern of an input signal output from the delay unit 122 agrees with the above-described peak generating pattern, a peak detection signal is output from the peak generating pattern storing part 130. Thus, according to the amplitude detecting circuit 111a, it is sufficient to detect the agreement between the pattern of the input signal and the peak generating pattern, and therefore, the detection of the peak can be performed with a very simple circuit structure.

According to the present invention, the amplitude detecting circuit has a structure corresponding to the part where the energy is concentrated in the full impulse response of the signal processing digital filter, that is, a structure composed of a simple digital filter made of only the taps having coefficients of large absolute values and considerably affecting on the output amplitude among all taps of the above-described digital filter, and therefore, the reduction of the circuit scale can be attained. Furthermore, by this simple digital filter, the output amplitude of the signal processing digital filter is approximately detected, and therefore, the processing delay according to the amplitude detection can be reduced.

What is claimed is:

1. An amplitude detecting circuit comprising:
   a simple digital filter having a plurality of taps corresponding to that portion of a non-recursive signal processing digital filter where energy is concentrated in a full impulse response of said non-recursive signal processing digital filter;
   wherein an input signal is supplied to both said signal processing digital filter and to said simple digital filter and wherein an output amplitude of said signal processing digital filter is approximated by an output of said simple digital filter.

2. An amplitude detecting circuit according to claim 1, said simple digital filter further having an amplitude storing part for storing information of an output amplitude corresponding to a pattern of a supplied signal, and making the information of an output amplitude read out of said amplitude storing part as an output of said simple digital filter.

3. An amplitude detecting circuit according to claim 1, said simple digital filter further having a peak generating pattern storing part for storing a peak generating pattern that is a pattern of a signal generating an output amplitude of a given value or more, and that a peak detection signal is output from said peak generating pattern storing part, when a pattern of a supplied signal agrees with said peak generating pattern.

4. An amplitude detecting circuit according to claim 1, further comprising:
- a plurality of delay units;
- a plurality of multipliers respectively connected to a corresponding delay unit and having predetermined coefficient; and
- one adder respectively connected to the multipliers.

5. An amplitude detecting circuit comprising:
- a simple digital filter having a plurality of taps corresponding to that portion of a non-recursive signal processing digital filter where energy is concentrated in a full impulse response of said non-recursive signal processing digital filter;
- wherein an input signal is supplied to both said signal processing digital filter and to said simple digital filter and wherein an output amplitude of said signal processing digital filter is approximated by an output of said simple digital filter, and wherein said plurality of taps of said simple digital filter are selected such that said plurality of taps are located around a tap having a coefficient of the maximum absolute value among all taps of said signal processing digital filter when a signal by which an output amplitude becomes maximum is supplied to said signal processing digital filter, and
- further wherein said plurality of taps are selected so that the ratio of the sum total of absolute values of coefficients of selected taps to the sum total of absolute values of coefficients of all taps of said signal processing digital filter is greater than or equal to a fixed value.

6. An amplitude detecting circuit according to claim 5, wherein said fixed value is set according to required detection accuracy of an output amplitude.

7. An automatic gain controller comprising:
- an amplifier for amplifying an input signal;
- an A/D converter for converting an output of the amplifier into a digital signal;
- a digital filter for processing the supplied digital signal;
- an amplitude detecting circuit for detecting an amplitude of an output signal from the digital filter, to which the digital signal from the A/D converter is supplied;
- a gain control circuit signal for generating a gain control signal on the basis of the amplitude of the detected output signal, and for supplying the gain control signal to the amplifier,
  - wherein said amplitude detecting circuit comprises: a simple digital filter having a plurality of taps corresponding to that portion of a non-recursive signal processing digital filter where energy is concentrated in a full impulse response of said non-recursive signal processing digital filter; and
  - wherein an input signal is supplied to both said signal processing digital filter and to said simple digital filter and wherein an output amplitude of said signal processing digital filter is approximated by an output of said simple digital filter.

8. A peak suppression circuit comprising:
- a delay circuit for delaying an input signal;
- a digital filter for processing the supplied delayed input signal;
- an amplitude detecting circuit for detecting an amplitude of an output signal from the digital filter, to which the input signal is supplied;
- a peak suppression control circuit for generating a peak suppression control signal on the basis of the amplitude of the detected output signal, and for supplying the peak suppression control signal to the digital filter,
  - wherein aid amplitude detecting circuit comprises: a simple digital filter having a plurality of taps corresponding to that portion of a non-recursive signal processing digital filter where energy is concentrated in a full impulse response of said non-recursive signal processing digital filter; and
  - wherein an input signal is supplied to both said signal processing digital filter and to said simple digital filter and wherein an output amplitude of said signal processing digital filter is approximated by an output of said simple digital filter.

* * * * *